(12) United States Patent
Chiu et al.

(10) Patent No.: US 8,866,236 B2
(45) Date of Patent: Oct. 21, 2014

(54) PACKAGE STRUCTURE HAVING MEMS ELEMENT

(75) Inventors: Chi-Hsin Chiu, Taichung (TW);
Chih-Ming Huang, Taichung (TW);
Chang-Yueh Chan, Taichung (TW);
Hsin-Yi Liao, Taichung (TW);
Chun-Chi Ke, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 495 days.

(21) Appl. No.: 12/769,993

(22) Filed: Apr. 29, 2010

(65) Prior Publication Data

US 2011/0175179 A1 Jul. 21, 2011

(30) Foreign Application Priority Data

Jan. 20, 2010 (TW) .............................. 99101443 A

(51) Int. Cl.
| | | |
|---|---|---|
| H01L 29/84 | (2006.01) | |
| H01L 23/31 | (2006.01) | |
| H01L 21/56 | (2006.01) | |
| B81B 7/00 | (2006.01) | |
| H01L 23/552 | (2006.01) | |
| H01L 23/00 | (2006.01) | |

(52) U.S. Cl.
CPC .............. *H01L 21/56* (2013.01); *H01L 23/315* (2013.01); *H01L 2924/01046* (2013.01); *H01L 2224/48465* (2013.01); *B81B 2207/095* (2013.01); *H01L 24/48* (2013.01); *H01L 2924/09701* (2013.01); *B81B 7/007* (2013.01); *H01L 2924/3025* (2013.01); *H01L 2924/01079* (2013.01); *H01L 2924/01013* (2013.01); *H01L 2224/48227* (2013.01); *H01L 23/552* (2013.01); *H01L 2924/01029* (2013.01)

USPC .................... 257/415; 257/419; 257/E29.324

(58) Field of Classification Search
CPC ........... H01L 2224/48227; H01L 2924/01013; H01L 2924/01029; H01L 2924/01046; H01L 2924/01079; H01L 2924/00
USPC ......... 257/414, 415, 416, 417, 418, 419, 420, 257/E29.324, E21.499, E21.502
See application file for complete search history.

(56) References Cited

U.S. PATENT DOCUMENTS

| | | |
|---|---|---|
| 6,303,986 B1 | 10/2001 | Shook |
| 6,809,412 B1 | 10/2004 | Tourino et al. |
| 6,828,674 B2 | 12/2004 | Karpman |
| 6,846,725 B2 * | 1/2005 | Nagarajan et al. ............ 438/456 |
| 7,368,808 B2 | 5/2008 | Heck et al. |
| 7,843,021 B2 * | 11/2010 | Zhe et al. ....................... 257/416 |
| 2009/0085205 A1 * | 4/2009 | Sugizaki ........................ 257/737 |
| 2009/0160053 A1 * | 6/2009 | Meyer et al. ................... 257/738 |
| 2010/0096712 A1 * | 4/2010 | Knechtel ........................ 257/415 |

* cited by examiner

*Primary Examiner* — Cuong Q Nguyen
*Assistant Examiner* — Yosef Gebreyesus
(74) *Attorney, Agent, or Firm* — Edwards Wildman Palmer LLP; Peter F. Corless; Steven M. Jensen

(57) ABSTRACT

A package structure having at least an MEMS element is provided, including a chip having electrical connecting pads and the MEMS element; a lid disposed on the chip to cover the MEMS element and having a metal layer provided thereon; first sub-bonding wires electrically connecting to the electrical connecting pads; second sub-bonding wires electrically connecting to the metal layer; an encapsulant disposed on the chip, wherein the top ends of the first and second sub-bonding wires are exposed from the encapsulant; and metallic traces disposed on the encapsulant and electrically connecting to the first sub-bonding wires. The package structure advantageously features reduced size, relatively low costs, diverse bump locations, and an enhanced EMI shielding effect.

14 Claims, 7 Drawing Sheets

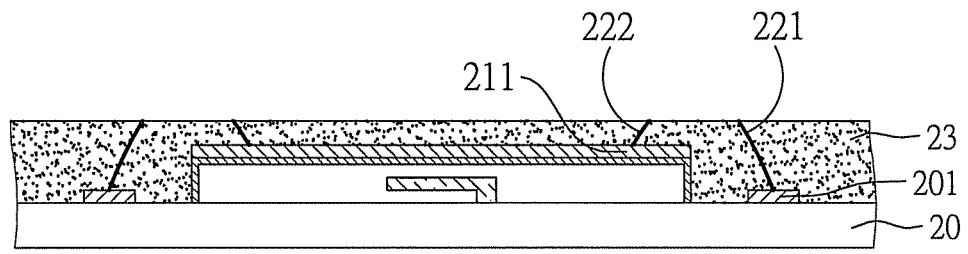
FIG. 2D
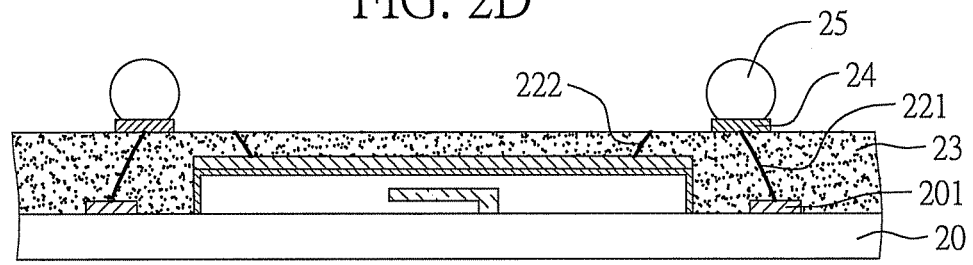
FIG. 2E
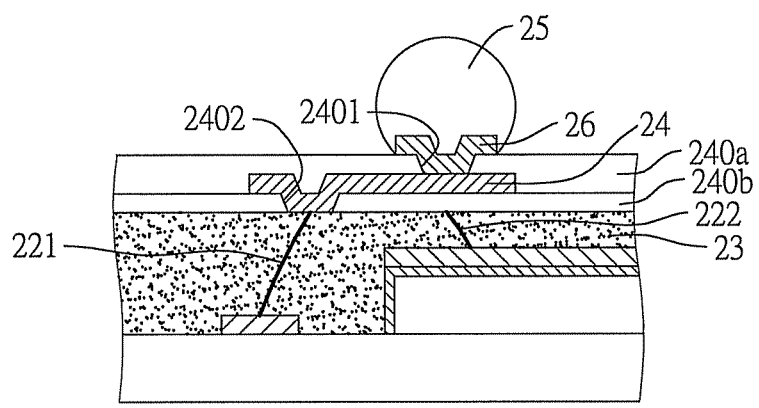
FIG. 2E'
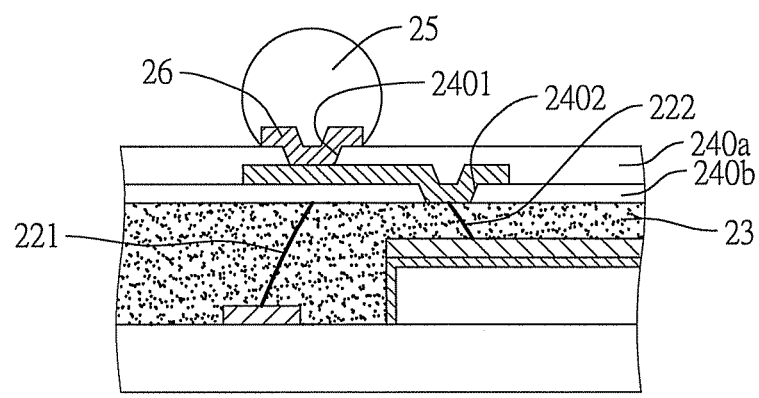
FIG. 2E"

US 8,866,236 B2

PACKAGE STRUCTURE HAVING MEMS ELEMENT

CROSS-REFERENCES TO RELATED APPLICATIONS

This application claims under 35 U.S.C. §119(a) the benefit of Taiwanese Application No. 099101443 filed Jan. 20, 2010 the entire contents of which is incorporated herein by reference.

BACKGROUND OF THE INVENTION

1. Field of the Invention

The present invention relates to package structures, and more particularly, to a package structure having at least a Micro Electro Mechanical System (MEMS) element.

2. Description of Related Art

Micro Electro Mechanical System (MEMS) techniques integrate electrical and mechanical functions into a single element using microfabrication technology. A MEMS element is disposed on a chip and covered by a shield or packaged with an underfill adhesive so as to form a MEMS package structure. FIGS. 1A to 1F are cross-sectional views showing different package structures with a MEMS element.

FIG. 1A shows a package structure disclosed by U.S. Pat. No. 6,809,412. Referring to FIG. 1A, the package structure comprises a substrate 10, a chip 14 disposed on the substrate 10 and having a MEMS element 141, a plurality of bonding wires 11 electrically connecting the substrate 10 and the chip 14, and a lid 12 disposed on the substrate 10 to cover the chip 14, the MEMS element 141 and the bonding wires 11.

FIG. 1B shows a package structure disclosed by U.S. Pat. No. 6,303,986. Referring to FIG. 1B, the package structure comprises a lead frame 10', a chip 14 disposed on the lead frame 10' and having a MEMS element 141, a lid 12 disposed on the chip 14 for covering the MEMS element 141, a plurality of bonding wires 11 electrically connecting the lead frame 10' and the chip 14, and a packaging material 15 covering the lead frame 10', the bonding wires 11, the lid 12 and the chip 14.

However, the use of the carriers (the substrate 10 of FIG. 1A and the lead frame 10' of FIG. 1B) increases the thickness of the overall structures and cannot meet the demand for miniaturization. Accordingly, package structures without a carrier are developed, as shown in FIGS. 1C to 1D.

FIG. 1C shows a package structure disclosed by U.S. Pat. No. 7,368,808. Referring to FIG. 1C, the package structure comprises: a chip 14 with electrical connection pads 140; a MEMS element 141 disposed on the chip 14; and a lid 12 disposed to cover the MEMS element 141, wherein a plurality of conductive through holes 120 is formed in the lid 12, and a plurality of contact pads 122 are disposed at the two sides of the conductive through holes 120, such that the contact pads 122 located at the inner sides of the lid 12 are electrically connected to the electrical connection pads 140 of the chip 14, respectively. Further, a plurality of solder balls 16 is formed on the contact pads 122 located at the outer sides of the lid 12 for electrically connecting the chip 14 to another electronic element.

FIG. 1D shows a package structure disclosed by U.S. Pat. No. 6,846,725. Referring to FIG. 1D, the package structure comprises: a chip 14 with electrical connection pads 140; a MEMS element 141 disposed on the chip 14; and a lid 12 disposed to cover the MEMS element 141, wherein a plurality of solder bumps 142 is formed on the electrical connection pads 140, a plurality of conductive through holes 120 is formed in the lid 12 and a plurality of contact pads 122 are disposed at the two sides of the conductive through holes 120, respectively, and the contact pads 122 located at the inner sides of the lid 12 are electrically connected to the solder bumps 142, and the contact pads 122 located at the outer sides of the lid 12 are used for electrically connecting the chip 14 to another electronic element.

The above structures dispense with a carrier and meet the demand for miniaturization. However, forming the conductive through holes 120 in the lid 12 by drilling incurs high costs. In addition, misalignment or unstable connection can easily occur to the contact pads 122 which flank the conductive through holes 120, thus leading to poor electrical connection and further adversely affecting the electrical connection quality between the chip 14 and the external electronic element. Accordingly, a package structure dispensing with conductive through holes is provided, as shown in FIG. 1E.

FIG. 1E shows a package structure disclosed by U.S. Pat. No. 6,828,674. Referring to FIG. 1E, the package structure comprises: a chip 14 with electrical connection pads 140; a MEMS element 141 disposed on the chip 14; a lid 12 with traces 121 at an outer side thereof; a support 13 attached to the chip 14 for supporting the lid 12; a plurality of bonding wires 11 electrically connecting the traces 121 and the electrical connection pads 140; and a packaging material 15 encapsulating the bonding wires 11, the lid 12 and the chip 14, wherein the packaging material 15 has an opening 150 for exposing a portion of the traces 121 such that solder balls 16 are formed on the exposed portion of the traces 121 so as to electrically connect to another electronic device.

However, the above package structure requires a lithography process for forming the traces on the lid, thus incurring high costs. In addition, the solder balls 16 are confined to the vicinity of the lid to thereby cause solder ball bridge, limit the signal input/output density of the package structure and reduction of the trace spacing, add to the difficulty in attaching the package structure to a circuit board. As such, the application field of the package structure is limited. In addition, corresponding to the package structure, a fine pitch circuit board is required, thus increasing the cost. Further, such a package structure cannot achieve an EMI shielding effect.

Therefore, it is imperative to overcome the above drawbacks of the prior art.

SUMMARY OF THE INVENTION

In view of the above drawbacks of the prior art, the present invention provides a package structure having at least a Micro Electro Mechanical System (MEMS) element, which comprises: a chip having a plurality of electrical connection pads and the at least an MEMS element; a lid disposed on the chip to cover the MEMS element and having a metal layer provided thereon; a plurality of first sub-bonding wires electrically connecting to the electrical connection pads, respectively; a plurality of second sub-bonding wires electrically connecting to the metal layer; an encapsulant disposed on the chip and covering the lid, the first sub-bonding wires and the second sub-bonding wires, wherein the top ends of the first sub-bonding wires and the second sub-bonding wires are exposed from the top surface of the encapsulant; and a plurality of metallic traces disposed on the encapsulant and electrically connecting to the first sub-bonding wires.

In another embodiment, the metallic traces are electrically connected to the second sub-bonding wires.

The present invention further provides another package structure having at least a Micro Electro Mechanical System (MEMS) element, which comprises: a chip having a plurality of electrical connection pads and the at least an MEMS element; a lid disposed on the chip for covering the MEMS element; a plurality of first sub-bonding wires electrically connecting to the electrical connection pads, respectively; an encapsulant disposed on the chip and covering the lid and the first sub-bonding wires, wherein the top surface of the encapsulant is flush with the top surface of the lid, and the top ends of the first sub-bonding wires are exposed from the top surface of the encapsulant; and a plurality of metallic traces disposed on the encapsulant and electrically connecting to the first sub-bonding wires.

The present invention further provides a package structure having at least a Micro Electro Mechanical System (MEMS) element, which comprises: a chip having a plurality of electrical connection pads and the at least an MEMS element; a lid disposed on the chip to cover the MEMS element and having a metal layer provided thereon; a plurality of first sub-bonding wires electrically connecting to the electrical connection pads, respectively; a plurality of second sub-bonding wires electrically connecting to the metal layer; an encapsulant disposed on the chip and covering the lid, the first sub-bonding wires and the second sub-bonding wires, wherein the top ends of the first sub-bonding wires and the second sub-bonding wires are exposed from the top surface of the encapsulant; and a plurality of metallic traces disposed on the encapsulant and composed of first sub-metallic traces and second sub-metallic traces, wherein the first sub-metallic traces electrically connect to the first sub-bonding wires, and the second sub-metallic traces electrically connect to the second sub-bonding wires.

According to the present invention, the package structure having at least a Micro Electro Mechanical System (MEMS) element is provided directly on a wafer without the need of a carrier, thus reducing the thickness of the overall structure. Further, the position of the bumps is not limited to the top of the lid. Instead, the bumps are disposed at any positions of the top surface of the package structure. Furthermore, the lid is connected to a ground end through the sub-bonding wires and the metallic traces so as to achieve an EMI shielding effect.

BRIEF DESCRIPTION OF DRAWINGS

FIGS. 2A to 2F are cross-sectional views showing a package structure having a MEMS element according to a first embodiment of the present invention, wherein FIGS. 2E' and 2E" are partially enlarged views showing other embodiments of the structure;

DETAILED DESCRIPTION OF PREFERRED EMBODIMENTS

The following illustrative embodiments are provided to illustrate the disclosure of the present invention, these and other advantages and effects can be apparent to those in the art after reading this specification.

First Embodiment

FIGS. 2A to 2F are cross-sectional views showing a package structure having at least a Micro Electro Mechanical System (MEMS) element according to a first embodiment of the present invention.

Figure 1A:
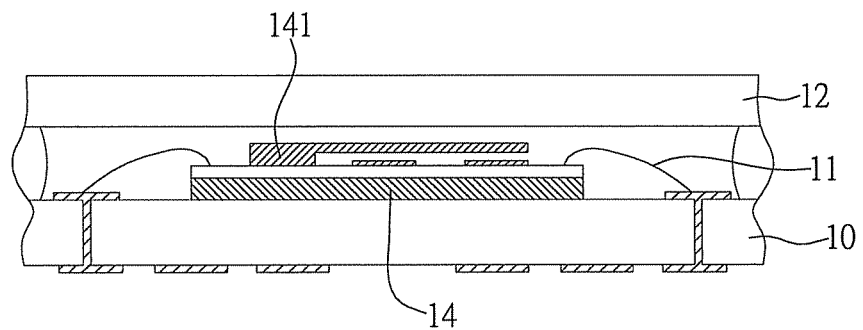
FIGS. 1A to 1E are cross-sectional views showing conventional package structures having a MEMS element.
Figure 1B:
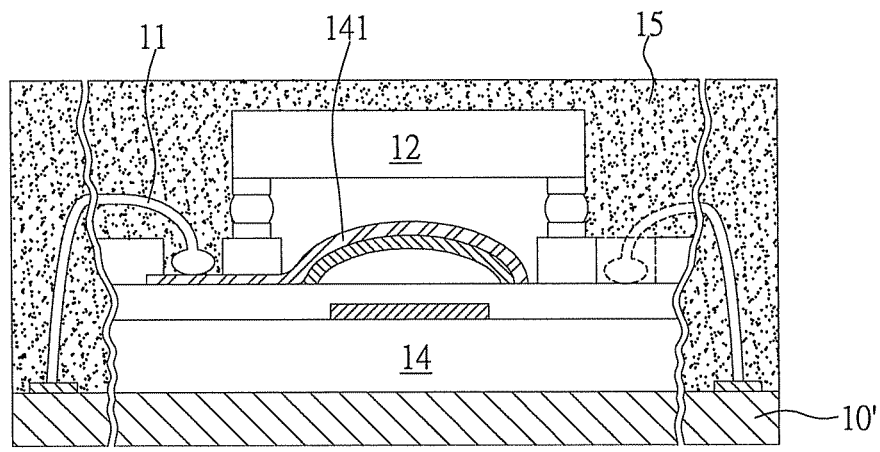
Figure 1C:
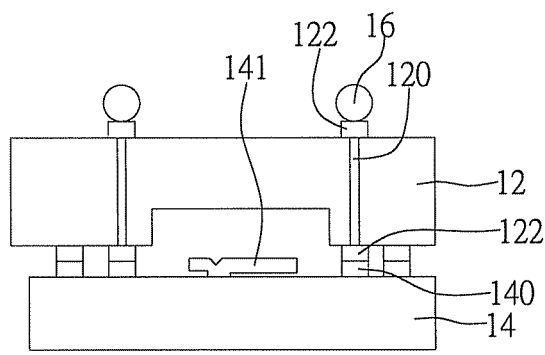
Figure 1D:
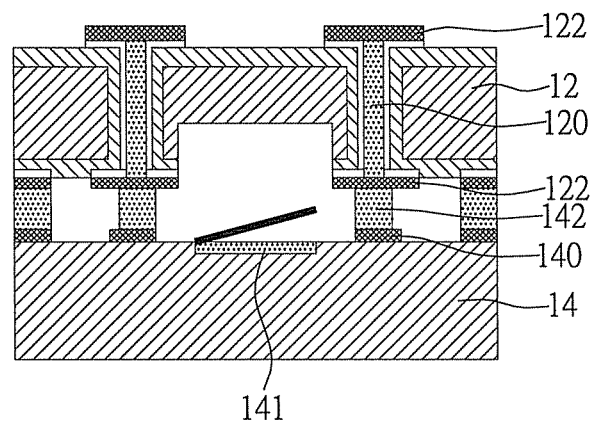
Figure 1E:
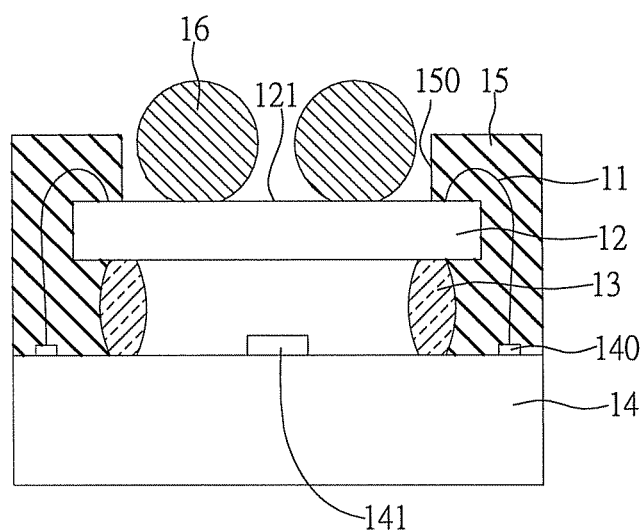
Figure 2A:
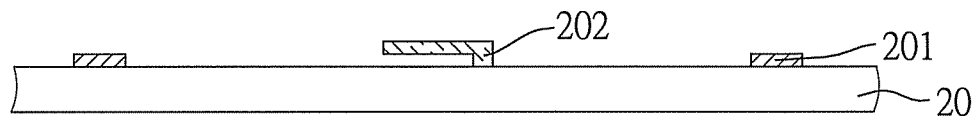

Referring to FIG. 2A, a wafer 20 is prepared, which has a plurality of electrical connection pads 201 and a plurality of MEMS elements 202. It should be noted that only a portion of the wafer is shown in FIG. 2A.

Figure 2B:
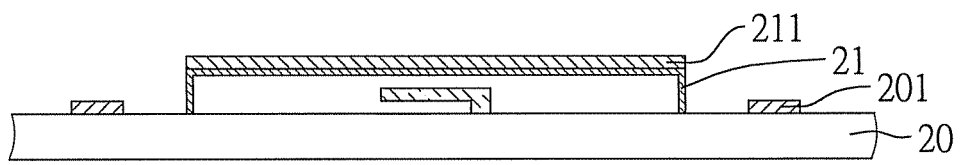
Figure 2B:
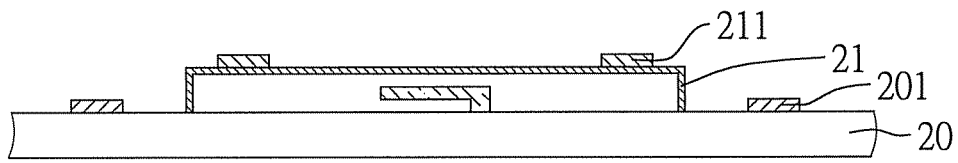

Referring to FIG. 2B, a plurality of lids 21 is disposed on the wafer 20 for covering the MEMS elements 202, respectively. The wafer 20 is made of silicon. The MEMS elements 202 are gyroscopes, accelerometers or RF MEMS elements. The lids 21 are made of a conductive material or a non-conductive material such as glass, silicon, metal or ceramic. A metal layer 211 or a plurality of bonding pads, as shown in FIG. 2B', is further provided on each of the lids 21 by such as sputtering, which are made of Al, Cu, Au, Pd, Ni/Au, Ni/Pd, TiW/Au, Ti/Al, TiW/Al, Ti/Cu/Ni/Au or a combination thereof. After the formation of the metal layer 211 on each of the lids 21, cavities are provided on the other side of each of the lids 21, such that the cavities are opposite to the metal layer 211.

Figure 2C:
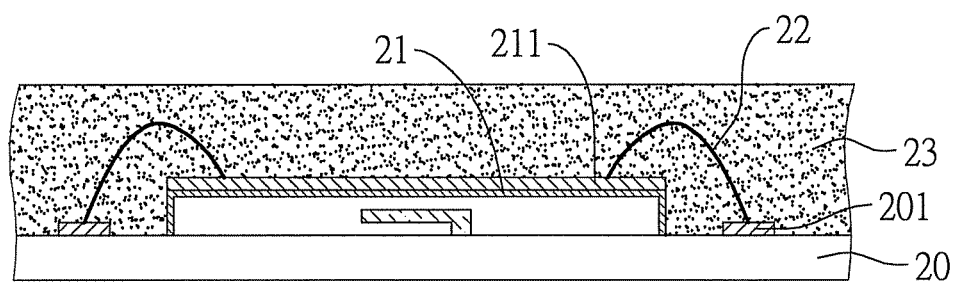

Referring to FIG. 2C, a plurality of bonding wires 22 electrically connect the electrical connection pads 201 and the metal layer 211, and an encapsulant 23 is formed on the wafer 20 to cover the lids 21, the bonding wires 22, the electrical connection pads 201 and the metal layer 211. Therein, the encapsulant 23 is made of a dielectric adhesive material such as a thermo-setting resin or silicone, wherein the thermo-setting resin is, for example, an epoxy resin, an epoxy molding compound (EMC) or polyimide.

Referring to FIG. 2D, a portion of the encapsulant 23 is removed, that is, the upper portion of the encapsulant 23 and the top portions of wire loops of the bonding wires 22 are removed such that each of the bonding wires 22 is divided into a first sub-bonding wire 221 and a second sub-bonding wire 222 which are separate from each other. The top ends of the first sub-bonding wires 221 and the second sub-bonding wires 222 are exposed from the top surface of the encapsulant 23. The first sub-bonding wires 221 are electrically connected to the electrical connection pads 201. The second sub-bonding wires 222 are electrically connected to the metal layer 211. The upper portion of the encapsulant 23 is removed by grinding, laser, plasma, chemical etching, or chemical mechanical polishing (CMP.)

Referring to FIG. 2E, a plurality of metallic traces 24 is provided on the encapsulant 23 to electrically connect to the first sub-bonding wires 221, respectively, and electrically isolate the second sub-bonding wires 222. In addition, one end of each of the metallic traces 24 is configured to extend towards the corresponding MEMS element 202 or the periphery of the MEMS element 202 (not shown.) The layout of the metallic traces 24 is flexibly adjusted according to the electrical demands and layout density limit. Furthermore, bumps 25 are provided on the metallic traces 24. For example, the bumps 25 are provided on the ends of the metallic traces 24. The bumps 25 are made of metal or alloy, and have soldering characteristics. The bumps 25 are preferably made of Sn/Pd, Sn/Ag/Cu or Au. Referring to FIG. 2E', prior to formation of the bumps 25, a first insulation layer 240a is provided on the encapsulant 23 and the metallic traces 24. The first insulation layer 240a has a plurality of openings 2401 for exposing the metallic traces 24. The bumps 25 are provided at the openings 2401 for electrically connecting to the metallic traces 24. In addition, prior to formation of the metallic traces 24, a second insulation layer 240b is provided on the encapsulant 23. The second insulation layer 240b has a plurality of openings 2402 for exposing the first sub-bonding wires 221 and electrically isolating the second sub-bonding wires 222. The structure shown in FIG. 2E' is achieved through redistribution layer (RDL) technique.

An insulation layer (not shown,) such as green paint, is formed before the bumps 25 are formed. The insulation layer has a plurality of openings for exposing the metallic traces 24 such that the bumps 25 are electrically connected to the exposed metallic traces 24.

In another embodiment as shown in FIG. 2E", the second insulation layer 240b has a plurality of openings 2402 for exposing the second sub-bonding wires 222 and electrically isolating the first sub-bonding wires 221, and the metallic traces 24 electrically connect to the second sub-bonding wires 222. A first insulation layer 240a is provided on the encapsulant 23 and the metallic traces 24 and has a plurality of openings 2401 for exposing the metallic traces 24, and the bumps 25 are provided at the openings 2401 for electrically connecting to the metallic traces 24. The layout of the metallic traces 24 is designed to stay away from the top of the second sub-bonding wires 222 to achieve an electrical isolation effect (not shown.)

Furthermore, an under bump metal layer 26 is formed at the openings 2401 of the first insulation layer 240a before the bumps 25 are formed.

Figure 2F:
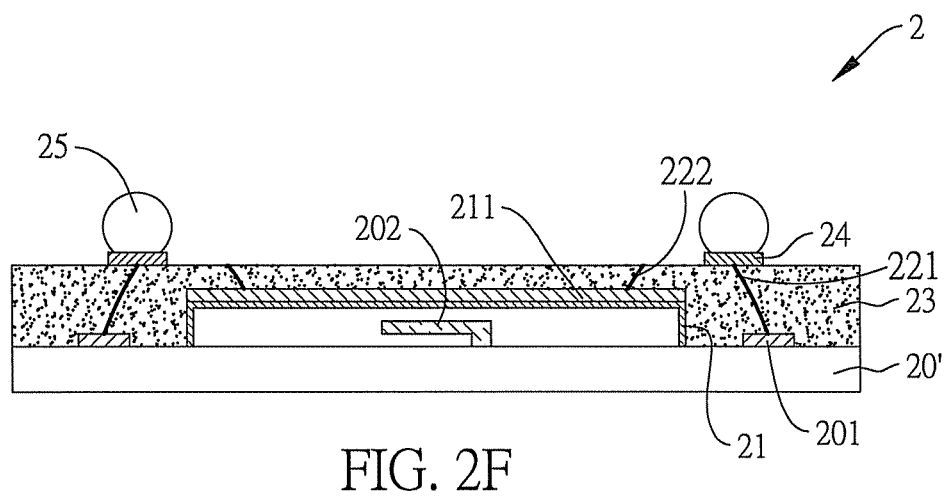

Referring to FIG. 2F, a singulation process is performed to obtain a plurality of package structures 2 each having a MEMS element 202.

The present invention further discloses a package structure 2 having a MEMS element, which comprises: a chip 20' having a plurality of electrical connection pads 201 and at least a MEMS element 202; a lid 21 disposed on the chip 20' for covering the MEMS element 202 and having a metal layer 211 provided thereon; a plurality of first sub-bonding wires 221 electrically connecting to the electrical connection pads 201; a plurality of second sub-bonding wires 222 electrically connecting to the metal layer 211; an encapsulant 23 disposed on the chip 20' and covering the lid 21, the first sub-bonding wires 221 and the second sub-bonding wires 222, wherein the top ends of the first sub-bonding wires 221 and the second sub-bonding wires 222 are exposed from the top surface of the encapsulant 23; and a plurality of metallic traces 24 disposed on the encapsulant 23 and electrically connecting to the first sub-bonding wires 221.

In another embodiment, as shown in FIG. 2E", the metallic traces 24 are disposed on the encapsulant 23 and electrically connecting to the second sub-bonding wires 222. In a preferred embodiment, the packaging structure 2 further comprises a first insulation layer 240a provided on the encapsulant 23 and the metallic traces 24 and having a plurality of openings 2401 for exposing the metallic traces 24, and a plurality of bumps 25 is formed at the openings 2401 for electrically connecting to the metallic traces 24. The packaging structure 2 further comprises a second insulation layer 240b on the encapsulant 23 and having openings 2402 for exposing the first sub-bonding wires 221 or the second sub-bonding wires 222 such that the metallic traces 24 are provided in the openings 2402 and on the second insulation layer 240b.

In the embodiment where the first insulation layer 240a is provided, the package structure 2 further comprises an under bump metal layer 26 formed between the bumps 25 and the first insulation layer 240a.

In the package structure 2 having a MEMS element of the present invention, each of the metallic traces 24 has one end extending towards the corresponding MEMS element 202 and having a bump 25 provided thereon. To be specific, the metallic traces 24 essentially extend from the electrical connection pads 201 to the MEMS elements 202.

In the package structure 2, the chip 20' is made of silicon. The MEMS element 202 is a gyroscope, an accelerometer or a RF MEMS element. The lid 21 is made of a conductive material or a non-conductive material such as metal, silicon, glass or ceramic. The metal layer 211 is made of Al, Cu, Au, Pd, Ni/Au, Ni/Pb, TiW/Au, Ti/Al, TiW/Al, Ti/Cu/Ni or a combination thereof. The package layer 23 is made of a dielectric adhesive material such as a thermo-setting resin or silicone. The thermo-setting resin is, for example, an epoxy resin, an epoxy molding compound (EMC) or polyimide.

In the case the metallic traces are electrically isolated from the second sub-bonding wires, one end of each of the metallic traces 24 extends towards the MEMS element 202 and even extends to the lid. At a position where the bottom of the metallic traces 24 is adjacent to the second sub-bonding wires 222, an insulation pad made of the same material as the second insulation layer 240b is configured to electrically isolate the second sub-bonding wires 222. Similarly, in the case the metallic traces are electrically isolated from the first sub-bonding wires, an insulation pad is disposed at a position where the bottom of the metallic traces 24 is adjacent to the first sub-bonding wires 221.

In the package structure 2, the electrical connection pads 201 are located at the outer periphery of the lid 21.

In the package structure 2, the bumps 25 are made of metal or alloy and having soldering characteristics. The bumps 25 are preferably made of Sn/Pb, Sn/Ag or Au.

Second Embodiment

Figure 3:
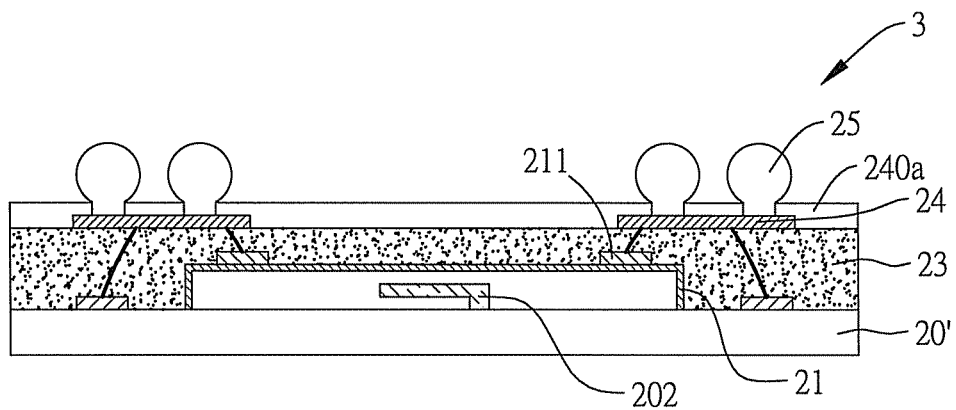
FIG. 3 is a cross-sectional view of a package structure having a MEMS element according to a second embodiment of the present invention.

FIG. 3 is a cross-sectional view of a package structure 3 having a MEMS element according to a second embodiment of the present invention. The package structure 3 of FIG. 3 is similar to the package structure 2 of FIG. 2F, but the main difference therebetween is that the metal layer 211 of the package structure 3 is composed of a plurality of bonding pads, and the metallic traces 24 electrically connect to the first sub-bonding wires 221 and the second sub-bonding wires 222, respectively.

Third Embodiment

Figure 4:
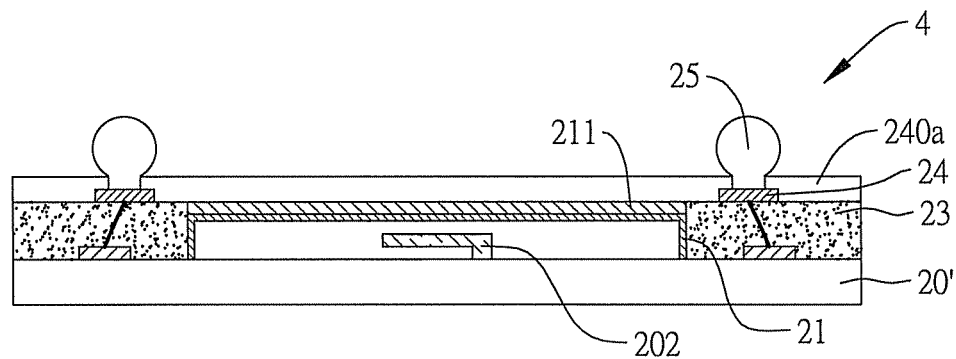
FIG. 4 is a cross-sectional view of a package structure having a MEMS element according to a third embodiment of the present invention.

FIG. 4 is a cross-sectional view of a package structure 4 having a MEMS element according to a third embodiment of the present invention. The package structure 4 in the third embodiment is similar to the package structure 2 of FIG. 2F, but a main difference therebetween is that the top surface of the encapsulant 23 of the package structure 4 is flush with the top surface of the lid 21, i.e., the metal layer 211 is exposed from the encapsulant 23, and the second sub-bonding wires 222 are removed at the time a portion of the encapsulant 23 is removed. As such, the first sub-bonding wires 221 are remained for electrically connecting to the electrical connection pads 201, and the top ends of the first sub-bonding wires 221 are exposed from the top surface of the encapsulant 23.

Fourth Embodiment

Figure 5:
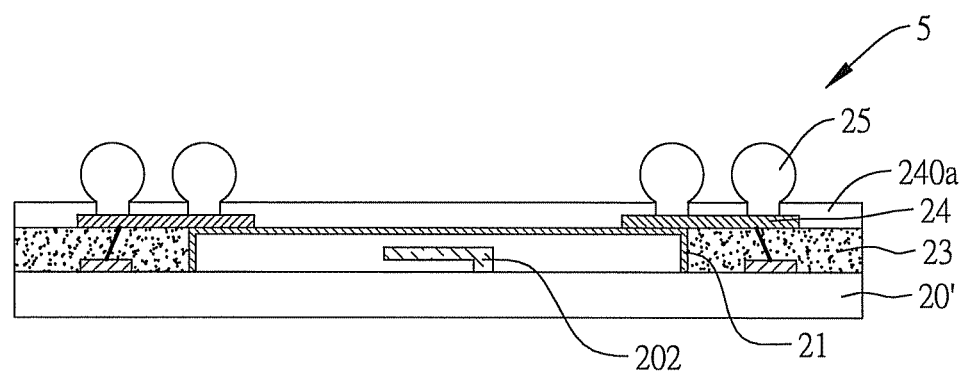
FIG. 5 is a cross-sectional view of a package structure having a MEMS element according to a fourth embodiment of the present invention.

FIG. 5 is a cross-sectional view of a package structure 5 having a MEMS element according to a fourth embodiment of the present invention. The package structure 5 in the fourth embodiment is similar to the package structure 4 in FIG. 4, but a big difference therebetween is that the metal layer 211 of the package structure 5 is removed at the time a portion of the encapsulant 23 is removed, and the metallic traces 24 extend to the lid 21.

Fifth Embodiment

Figure 6:
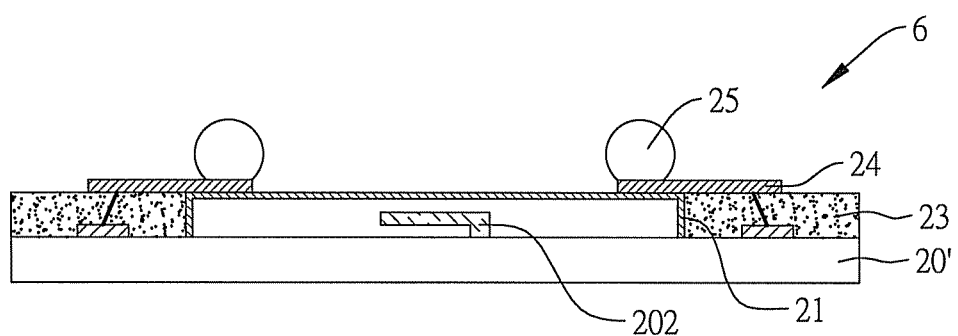
FIG. 6 is a cross-sectional view of a package structure having a MEMS element according to a fifth embodiment of the present invention.

FIG. 6 is a cross-sectional view of a package structure 6 having a MEMS element according to a fifth embodiment of the present invention. The package structure 6 in the fifth embodiment is similar to the package structure 5 in FIG. 5, but the main difference therebetween is that the metallic traces 24 extend on the lid 21.

Sixth Embodiment

Figure 7:
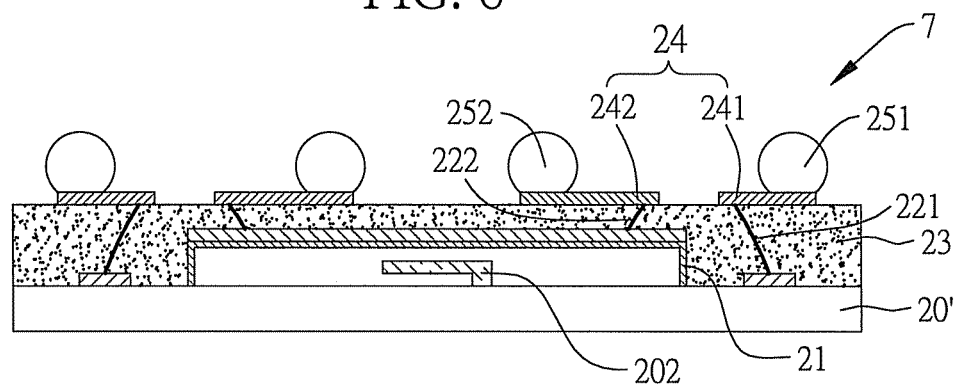
FIG. 7 is a cross-sectional view of a package structure having a MEMS element according to a sixth embodiment of the present invention.

FIG. 7 is a cross-sectional view of a package structure 7 having a MEMS element according to a sixth embodiment of the present invention. The package structure 7 in the sixth embodiment is similar to the package structure 2 of FIG. 2F, but the main differences therebetween include: the metallic traces 24 of the package structure 7 in the sixth embodiment are separated into first sub-metallic traces 241 electrically connecting to the first sub-bonding wire 221 and second sub-metallic traces 242 electrically connecting to the second sub-bonding wire 222; each of the first sub-metallic traces 241 has one end extending towards the periphery of the chip 20' and having a bump 251 provided thereon; and each of the second sub-metallic traces 242 has one end extending towards the periphery of the MEMS element 202 and having a bump 252 provided thereon.

Referring to FIG. 2E' again, the package structure 7 further comprises a first insulation layer provided on the encapsulant and the metallic traces and having a plurality of openings for exposing the metallic traces. The package structure 7 further comprises a second insulation layer (not shown) provided on the encapsulant and having a plurality of openings for exposing the first and second sub-bonding wires such that the metallic traces are provided in the openings and on the second insulation layer.

In the package structure 7, the second sub-bonding wires 222, the second sub-metallic traces 242 and the bumps 252 are grounded for achieving an EMI shielding effect.

According to the present invention, the package structure having a MEMS element is provided directly on a wafer without the need of a carrier, thus reducing the thickness of the overall structure. Further, the position of the bumps is not limited to the top of the lid. Instead, the bumps are disposed at any positions of the top surface of the package structure. Furthermore, the lid is connected to a ground end through the sub-bonding wires and the metallic traces so as to achieve an EMI shielding effect.

The above-described descriptions of the detailed embodiments are intended to illustrate the preferred implementation according to the present invention but are not intended to limit the scope of the present invention, Accordingly, all modifications and variations completed by those with ordinary skill in the art should fall within the scope of present invention defined by the appended claims.

What is claimed is:

1. A package structure having at least a Micro Electro Mechanical System (MEMS) element, comprising:
    a chip provided thereon with a plurality of electrical connection pads and the at least an MEMS element;
    a lid disposed on the chip to cover the MEMS element;
    a metal layer only disposed on a top surface of the lid and in direct physical contact with the lid;
    a plurality of first sub-bonding wires electrically connecting to the electrical connection pads, respectively;
    a plurality of second sub-bonding wires electrically connecting to the metal layer;
    an encapsulant disposed on the chip to cover the lid, the first sub-bonding wires and the second sub-bonding wires, wherein top ends of the first sub-bonding wires and the second sub-bonding wires are exposed from a top surface of the encapsulant; and
    a plurality of metallic traces disposed on the encapsulant and electrically connected to the first sub-bonding wires.

2. The structure of claim 1, further comprising a first insulation layer provided on the encapsulant and the metallic traces and having a plurality of openings for exposing the metallic traces.

3. The structure of claim 1, further comprising a second insulation layer provided on the encapsulant and having a plurality of openings for exposing the first sub-bonding wires such that the metallic traces are provided in the openings and on the second insulation layer.

4. The structure of claim 1, wherein the electrical connection pads are disposed at an outer periphery of the lid.

5. The structure of claim 1, wherein each of the metallic traces has an end extending towards the MEMS element and having a bump provided thereon.

6. The structure of claim 1, wherein the metal layer is composed of a plurality of bonding pads.

7. The structure of claim 1, wherein the metallic traces further electrically connect to the second sub-bonding wires.

8. The structure of claim 1, wherein the metallic traces are electrically isolated from the second sub-bonding wires.

9. A package structure having at least a Micro Electro Mechanical System (MEMS) element, comprising:
    a chip provided thereon with a plurality of electrical connection pads and the at least an MEMS element;
    a lid disposed on the chip to cover the MEMS element;
    a metal layer only disposed on a top surface the lid and in direct physical contact with the lid;
    a plurality of first sub-bonding wires electrically connecting to the electrical connection pads, respectively;
    a plurality of second sub-bonding wires electrically connecting to the metal layer;
    an encapsulant disposed on the chip to cover the lid, the first sub-bonding wires and the second sub-bonding wires, wherein top ends of the first sub-bonding wires and the second sub-bonding wires are exposed from a top surface of the encapsulant; and
    a plurality of metallic traces disposed on the encapsulant and electrically connected to the second sub-bonding wires.

10. The structure of claim 9, further comprising a first insulation layer provided on the encapsulant and the metallic traces and having a plurality of openings for exposing the metallic traces.

11. The structure of claim 9, further comprising a second insulation layer provided on the encapsulant and having a plurality of openings for exposing the second sub-bonding wires such that the metallic traces are provided in the openings and on the second insulation layer.

12. The structure of claim 9, wherein the electrical connection pads are disposed at an outer periphery of the lid.

13. The structure of claim 9, wherein each of the metallic traces has an end extending towards the MEMS element and having a bump provided thereon.

14. The structure of claim 9, wherein the metallic traces are electrically isolated from the first sub-bonding wires.

* * * * *